United States Patent
Park et al.

(10) Patent No.: US 8,298,926 B2
(45) Date of Patent: Oct. 30, 2012

(54) SILICON WAFER WITH CONTROLLED DISTRIBUTION OF EMBRYOS THAT BECOME OXYGEN PRECIPITATES BY SUCCEEDING ANNEALING AND ITS MANUFACTURING METHOD

(75) Inventors: Hyung-Kook Park, Gyeonggi-do (KR); Jin-Kyun Hong, Gyeonggi-do (KR); Kun Kim, Gyeongsangbuk-do (KR); Chung-Geun Koh, Seoul (KR)

(73) Assignees: Siltron Inc., Gumi, Gyeongsangbuk-do (KR); Hynix Semiconductor Inc., Icheon-si, Gyeonggi-do (KR)

( * ) Notice: Subject to any disclaimer, the term of this patent is extended or adjusted under 35 U.S.C. 154(b) by 456 days.

(21) Appl. No.: 12/521,268

(22) PCT Filed: Dec. 27, 2007

(86) PCT No.: PCT/KR2007/006881
§ 371 (c)(1),
(2), (4) Date: Jul. 24, 2009

(87) PCT Pub. No.: WO2008/082151
PCT Pub. Date: Jul. 10, 2008

(65) Prior Publication Data
US 2010/0038755 A1    Feb. 18, 2010

(30) Foreign Application Priority Data
Dec. 29, 2006   (KR) .................. 10-2006-0138443

(51) Int. Cl.
*H01L 21/324* (2006.01)
*C03B 25/00* (2006.01)
(52) U.S. Cl. .............. 438/522; 117/20; 117/89

(58) Field of Classification Search ................ None
See application file for complete search history.

(56) References Cited

U.S. PATENT DOCUMENTS

| 5,788,763 A | 8/1998 | Hayashi et al. |
| 5,951,755 A * | 9/1999 | Miyashita et al. .............. 117/89 |
| 6,264,906 B1 * | 7/2001 | Aihara et al. .............. 423/328.2 |
| 2001/0055689 A1 | 12/2001 | Park |
| 2005/0054124 A1 | 3/2005 | Mun et al. |
| 2006/0075957 A1 * | 4/2006 | Takeno et al. .................. 117/84 |

FOREIGN PATENT DOCUMENTS

| JP | 08-250505 | 9/1996 |
| KR | 10-2000-0075744 | 12/2000 |
| KR | 10-2003-0002300 | 1/2003 |
| KR | 10-2005-0024994 | 3/2005 |
| KR | 10-2006-0077811 | 7/2006 |
| WO | 98/38675 | 9/1998 |

OTHER PUBLICATIONS

International Search Report mailed Mar. 19, 2008 for PCT/KR2007/006881.

* cited by examiner

*Primary Examiner* — Zandra Smith
*Assistant Examiner* — Pamela E Perkins
(74) *Attorney, Agent, or Firm* — Lowe Hauptman Ham & Berner, LLP

(57) ABSTRACT

A method for making a silicon wafer includes the steps of generating and stabilizing embryos that become oxygen precipitates by succeeding thermal annealing applied during a semiconductor device manufacturing process. In the silicon wafer, embryos are substantially removed in a denuded zone, and embryos are distributed at a relatively higher concentration in a bulk region. Also, by controlling behaviors of embryos, a silicon wafer having a desired concentration profile of oxygen precipitates by succeeding thermal annealing is manufactured with high reliability and reproducibility.

10 Claims, 6 Drawing Sheets

SILICON WAFER WITH CONTROLLED DISTRIBUTION OF EMBRYOS THAT BECOME OXYGEN PRECIPITATES BY SUCCEEDING ANNEALING AND ITS MANUFACTURING METHOD

CROSS REFERENCE TO RELATED APPLICATION

This application claims the priority of Korean Patent Application No. 10-2006-0138443, filed on Dec. 29, 2006 in the KIPO (Korean Intellectual Property Office), the disclosure of which is incorporated herein in their entirety by reference. Further, this application is the National Phase application of International Application No. PCT/KR2007/006881, filed Dec. 27, 2007, which designates the United States and was published in English. Each of these applications is hereby incorporated by reference in their entirety into the present application.

TECHNICAL FIELD

The present invention relates to a silicon wafer used for making a semiconductor device and its manufacturing method, and more particularly to a technique for controlling oxygen precipitates formed by a succeeding annealing for making a semiconductor device into a predetermined distribution.

BACKGROUND ART

Generally, a silicon wafer is produced using a process of growing a silicon single crystal ingot, a slicing process for slicing the ingot into a disk-shaped wafer, and a polishing process for making a wafer surface into a mirror surface. This silicon wafer is used for making a semiconductor device. However, as crystal defects and unintended impurities according to a growth history during the growing process of a silicon single crystal, oxygen is particularly included in the silicon single crystal. This oxygen is grown into oxygen precipitates by heat applied during the semiconductor device manufacturing procedure. The oxygen precipitates show beneficial features such as reinforcing strength of the silicon wafer and acting as an internal gettering site, but also show harmful features such as causing current leakage and fails of semiconductor devices.

Thus, there is needed a wafer wherein such oxygen precipitates are substantially not present in a denuded zone to a predetermined depth from a wafer surface on which a semiconductor device is formed, but oxygen precipitates exist with predetermined concentration and distribution in a bulk region over the predetermined depth. There have been proposed the following techniques to provide a wafer in which concentration and distribution of oxygen precipitates are controlled.

First, Korean Patent Registration No. 395391 discloses a wafer having a vacancy concentration profile that has a peak concentration at a center plane (or, in a bulk region) and is substantially decreased toward a front surface of a wafer, by means of RTP (Rapid Thermal Processing) for several to several ten seconds at a temperature of 1,150° C. or above to a wafer. Also, Korean Patent Registration No. 450676 discloses a wafer having an oxygen precipitation concentration profile in a substantial M shape as shown in FIG. 1, by means of RTP for 5 to several ten seconds at 1,100 to 1,200° C. Also, Korean Patent Registration No. 531552 discloses a wafer in which a concentration of BMD (Bulk Micro-Defect) including oxygen precipitates and bulk stacking faults shows a profile as shown in FIG. 2, by means of two-stage RTP for 1 to 5 seconds and 1 to 10 seconds respectively at 1,120 to 1,180° C. and 1,200 to 1,230° C.

However, in spite of the above documents, the demands of semiconductor device manufacturers on wafers having an oxygen precipitate concentration profile of desired concentration and distribution are more increased. In particular, the above documents are based on experiments of small-diameter wafers (8 inch or less), but semiconductor device manufacturers recently tend to use large-diameter wafers such as 12-inch wafer. However, the conventional defect control method for small-diameter wafers may not be applied to large-diameter wafers as they was. That is to say, a 12-inch wafer is also manufactured through ingot growth, slicing and polishing like 6-inch or 8-inch wafers, but its defect characteristic does not always satisfy arithmetic relations proportional to the wafer size. Thus, if the defect control method proposed in the above documents is applied based on arithmetic calculations proportion to the increase of wafer diameter, desired results are seldom obtained. Further, as wafers get greater, thermal annealing conditions applied to a wafer while making a semiconductor device are changed to make the problem more difficult. That is to say, oxygen precipitates grow into predetermined concentration and distribution due to the heat applied during the semiconductor device manufacturing process. Thus, though a wafer manufacturer supplies a wafer whose initial oxygen concentration is adjusted conforming to succeeding thermal annealing conditions (namely, thermal annealing applied during making a semiconductor device) optimized to a conventional small-diameter wafer, changing thermal annealing conditions applied during the semiconductor device manufacturing process may result in completely different results.

In addition, the above documents do not closely look into the mechanism how oxygen precipitates with desired concentration and distribution are generated, but they just check the mechanism in an indirect and inaccurate way after the fact, so they have drawbacks that they may not cope with various demands desired by semiconductor device manufacturers in an easy and reproducible way.

For example, Korean Patent Registration No. 395391 and 450676 intend to control concentration of oxygen precipitates to be formed by succeeding thermal annealing applied in the semiconductor device manufacturing process by controlling vacancy concentration of atomic level that does not allow direct checking. However, the assumption that vacancy concentration distribution of atomic level is linked to concentration distribution of oxygen precipitates is not yet proved, and direct measurement of the vacancy concentration distribution is impossible. In this consideration, the concentration profile of oxygen precipitates proposed by the above documents are considered to be lack of reliability and reproducibility. In addition, the Korean Patent Registration No. 531552 intends to control a BMD concentration profile of resultants all out in an experimental way, so any change of process conditions during low temperature thermal annealing (or, cooling process) between two-stage thermal annealing processes may derive entire different results.

DISCLOSURE

Technical Problem

The present invention is designed to solve the problems of the prior art, and therefore it is an object of the present invention to provide a method for making a wafer with high reliability and reproducibility, wherein concentration and distribution of oxygen precipitates to be formed by succeeding thermal annealing of the wafer are controlled into desired profile.

In addition, another object of the present invention is to provide a wafer in which concentration and distribution of oxygen precipitates to be formed by succeeding annealing are controlled into desired profile.

Technical Solution

In order to accomplish the above object, the present invention allows manufacturing a silicon wafer having a desired concentration profile of oxygen precipitates to be formed by succeeding thermal annealing with high reliability and reproducibility by controlling behaviors of embryos that become oxygen precipitates by succeeding thermal annealing applied during a semiconductor device manufacturing process.

That is to say, in one aspect of the present invention, there is provided a method for manufacturing a silicon wafer, which includes the steps of: preparing a wafer having a front surface, a rear surface and a rim edge connecting the front and rear surfaces; generating embryos, which become oxygen precipitates by succeeding annealing, in the silicon wafer; and stabilizing the embryos generated in the silicon wafer.

Here, the step of generating embryos may be conducted in a way of thermally annealing the silicon wafer at a first temperature, and the step of stabilizing the embryos may be conducted in a way of thermally annealing the silicon wafer with the embryos at a second temperature.

In addition, according to an embodiment of the present invention, after the step of stabilizing the embryos, a step of thermally annealing the silicon wafer so as to remove defects and the embryos existing within a predetermined depth from the front and rear surfaces of the silicon wafer may be further included.

Here, each thermal annealing is preferably a rapid thermal annealing (RTA, or RTP) conducted for 1 to several ten seconds.

In addition, there is also provided a method for manufacturing a silicon wafer, which includes the steps of: an embryo stabilizing step for growing embryos, which become oxygen precipitates by succeeding thermal annealing, existing in a silicon wafer to a predetermined criterion level, and then stabilizing the embryos; and a surface defect removing step for removing defects and embryos existing within a predetermined depth from front and rear surfaces of the silicon wafer.

Here, the embryo stabilizing step and the surface defect removing step may be conducted in this order or in a reversed order, and an embryo generating step for generating embryos in the silicon wafer may be further included.

The silicon wafer manufactured by the above method according to the present invention is a silicon wafer having a front surface, a rear surface, a rim edge connecting the front and second surfaces, a region between the front and rear surfaces, and a center plane in the region, wherein a first thermal annealing for generating embryos, which become oxygen precipitates by succeeding thermal annealing, in the silicon wafer, a second thermal annealing for stabilizing the embryos generated in the silicon wafer, and a third thermal annealing for removing defects and embryos within a predetermined depth from the front and second surfaces of the silicon wafer are conducted such that distribution of the embryos is changed in the region between the front and second surfaces according to a change of energy possessed by origins of the embryos.

Here, referring to a region corresponding to a predetermined depth from the front surface to the center plane as a surface layer and a region between the surface layer and the center plane as a bulk layer, the embryos are preferably distributed to have a greater concentration in the bulk layer rather than in the surface layer.

In addition, more specifically, the distribution of embryos may have a concentration profile that forms a peak on the center plane or a concentration profile that forms at least two peaks in a region between the front and rear surfaces.

In addition, in another aspect of the present invention, there is also provided a silicon wafer having a front surface, a rear surface, a rim edge connecting the front and rear surfaces, and a region between the front and rear surfaces, the silicon wafer comprising: a first denuded zone formed to a predetermined depth from the front surface of the silicon wafer; a second denuded zone formed to a predetermined depth from the rear surface of the silicon wafer; and a bulk region including a region between the first and second denuded zones, wherein a concentration of embryos becoming oxygen precipitates by succeeding thermal annealing in the bulk region substantially has a uniform distribution over the entire bulk region.

In the present invention as explained above, embryos that are grown into oxygen precipitates by succeeding thermal annealing are generated and stabilized such that the embryos are distributed into desired concentration and distribution.

The present invention may be particularly effective when being applied to a large-diameter wafer of 12 inch or above.

BEST MODE

Figure 1:
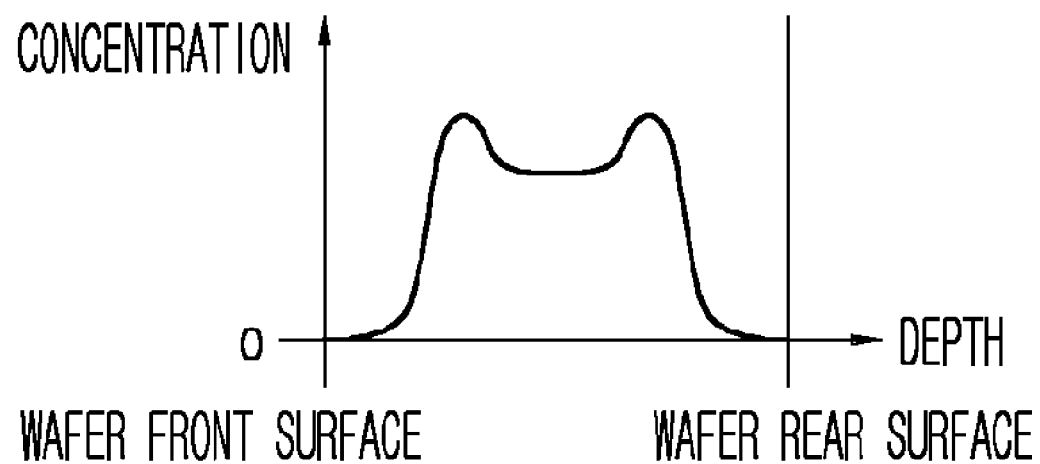
FIG. 1 is a graph showing a oxygen precipitate concentration profile after a succeeding annealing is conducted to a wafer to which RTP (Rapid Thermal Processing) is executed according to a prior art.

Hereinafter, a silicon wafer and its manufacturing method according to a preferred embodiment of the present invention will be described in detail with reference to the accompanying drawings.

Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

In the present invention, embryos that become oxygen precipitates by succeeding thermal annealing are generated and stabilized in a wafer obtained by slicing a silicon single crystal made in an ingot form. Here, embryos of the present invention will be explained first.

Generally, a crystalline nucleus is firstly generated in a uniform liquid or gas mixture (hereinafter, referred simply as a solution), and then a solid crystal is obtained during a crystallizing process in which the crystalline nucleus is grown. The crystalline nucleus may be formed from particles such as atoms, molecules and ions. In more detail, due to disordered behaviors of particles, individual particles may form a very loose aggregation that is called a cluster, and this cluster commonly disappears within a short time as returning to individual particles again. However, the cluster or individual particles may be combined into so-called embryos, which may be an origin of lattice arrangement. In general, such embryos have a short life cycle and thus return easily into cluster or individual particles. However, under sufficient super-saturation, embryos grow over a certain size (or, a threshold size) in thermodynamic equivalence with the solution, and then exist as inherent particles, not becoming individual particles. It is called a nucleus, and this nucleus may grow as a minimum unit of particle not to be resolved, thereby forming a crystal. That is to say, embryos may be unstable solid particles less than a threshold size, which may become a crystal by common growth.

The term 'embryos becoming oxygen precipitates by succeeding thermal annealing' used in the present invention is a combination of interstitial oxygen atoms and silicon atoms in a silicon wafer, and it may easily resolved to return to silicon atoms and interstitial oxygen atoms. However, by means of a suitable stabilizing step, the embryos are in a state of not being resolved but becoming oxygen precipitates by succeeding thermal annealing applied during a semiconductor device manufacturing process. That is to say, the 'embryos becoming oxygen precipitates by succeeding thermal annealing (hereinafter, referred to as embryos)' used in the present invention are different from oxygen vacancy of atomic level and also different from oxygen precipitates themselves, and, so to speak, the embryos have a relatively stabilized structure in a molecule level. Thus, the embryos stabilized in the present invention have a concept different from traditional embryos that are unstable and easily return to individual particles.

That is to say, an approach to conventional oxygen precipitates may be expressed using the following relationship (1). In the relationship (1), vacancy and interstitial Si are in a combination of atomic level, whose concentration cannot be directly measured so far. Thus, a correlation with resultant oxygen precipitates is not clearly proven using this model.

$$(1+y)Si+2O_{interstitial}+x\text{Vacancy } SiO_2+Si_{interstitial} \quad (1)$$

Meanwhile, the embryos of the present invention may have a concept as expressed in the following relationship (2).

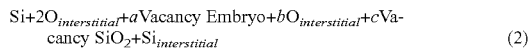

$$Si+2O_{interstitial}+a\text{Vacancy Embryo}+bO_{interstitial}+c\text{Vacancy } SiO_2+Si_{interstitial} \quad (2)$$

That is to say, the embryos in the middle term of the relationship (2) are corresponding to an intermediate stage of vacancy of atomic level and resultant oxygen precipitates, which joins correlations that were unclear in the prior art. Detailed correlations will be explained later.

Meanwhile, the density of BMD including oxygen precipitates that act as an internal gettering site is influenced by initial oxygen concentration, crystal defect region, and thermal annealing conditions during the semiconductor device manufacturing process. Among them, the thermal annealing conditions during the semiconductor device manufacturing process vary depending on semiconductor device manufacturers, and it is impossible to set exact conditions. In addition, the present invention is directed to providing a high quality thermally annealed wafer regardless of such succeeding thermal annealing conditions. Thus, influences of each factor (initial oxygen concentration and crystal defect region) except for the succeeding thermal annealing conditions, affected on the BMD density were analyzed, and conditions of each factor capable of ensuring sufficient gettering ability were calculated.

As a result, the initial oxygen concentration (Initial Oi), Delta Oi and BMD density were found to be proportional to each other, and it was also found that an initial oxygen concentration of 12 ppma or above was required to ensure sufficient internal gettering ability. Meanwhile, in relation to the crystal defect region, the initial oxygen concentration, Delta Oi and BMD density showed positive (+) correlations in a vacancy-rich region, but their correlations were shown not great in an interstitial-rich region. That is to say, it means that, in case of the interstitial-rich region, Delta Oi and BMD density are not seriously influenced by the initial oxygen concentration. Also, as a result, though the initial oxygen concentration is uniformly distributed in the wafer, oxygen precipitates may be not uniformly distributed in the wafer depending on the crystal defect region, resultantly causing deviation of the internal gettering ability. It means that a yield of semiconductor devices may be greatly influenced thereon.

In addition, when checking a correlation between an actual BMD (oxygen precipitate) density and gettering ability, it was found that the gettering ability is generally higher as the oxygen precipitate density is greater. However, there was great deviation depending on the crystal defect region, as mentioned above. In spite of that, if the BMD density is over a certain level, the gettering ability was shown over a practical level despite the deviation depending on the region.

In conclusion, in order to provide a wafer having sufficient gettering ability in the semiconductor device manufacturing process, it is required to grow an ingot having an initial oxygen concentration of 12 ppma or above and also having only a vacancy-rich crystal defect region. However, it is difficult or not practical in the current technology level. Accordingly, the inventors introduce the concept of embryo that grows into oxygen precipitates by succeeding thermal annealing, and thus provide a method for realizing a desired BMD level by making embryos into uniform distribution and high density with respect to wafers not satisfying the above criterion.

Now, a method for manufacturing a silicon wafer according to an embodiment of the present invention and a silicon wafer manufactured by the method will be explained with reference to FIGS. 3 to 7.

Figure 3:
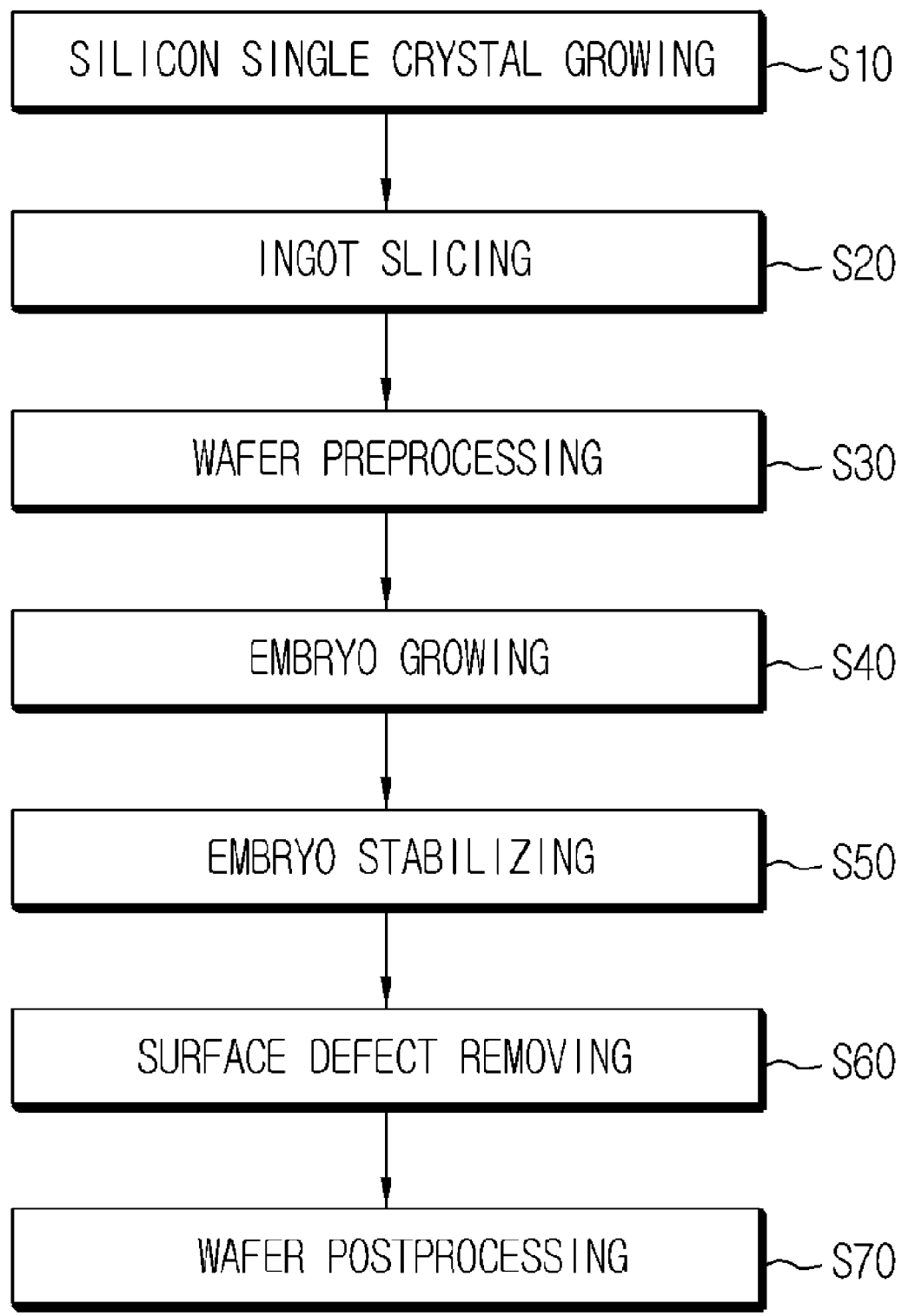
FIG. 3 is a flowchart illustrating a process of manufacturing a silicon wafer according to an embodiment of the present invention.

FIG. 3 is a flowchart illustrating the whole process of manufacturing a wafer according to the embodiment of the present invention. The method for manufacturing a wafer according to this embodiment generally includes steps of preparing a wafer (S10 to S30), steps of generating and stabilizing embryos (S40, S50), a step of removing wafer surface defects (S60), and a post-processing step such as cleaning (S70). Here, the essential part of the present invention are the steps S40 to S60, which will be explained in detail later with reference to a diagram of FIG. 4 and schematic diagrams of FIGS. 5 to 7. Meanwhile, the other steps (S10 to S30 and S70) may be conducted according to common ways well known in the art, so they will be explained in brief.

First, for preparing a silicon wafer, a silicon single crystal of an ingot form is grown using a common method such as Czochralski process (S10). That is to say, a seed crystal is put into a silicon melt melted in a crucible, and then the silicon single crystal is grown while controlling a crystal growing velocity (V) and a temperature gradient (G) in a growing direction on a melt interface. Subsequently, the ingot that is a grown silicon single crystal is sliced into disk-shaped wafers (S20). Subsequently, as a wafer preprocessing step (S30), an etching process is conducted to remove damages generated during the slicing process.

Subsequently, the steps of generating and stabilizing embryos according to this embodiment are conducted, specifically using RTP as described below.

First, the preprocessed wafer as mentioned above is loaded on a RTP equipment (between 0 and $t_1$ in FIG. 4), and them a temperature is rapidly increased to a first temperature ($T_1$, for example 1,100 to 1,200) at a temperature increasing rate (for example, 50/sec) (between $t_1$ and $t_2$). If the temperature in the equipment reaches the first temperature ($T_1$), the first temperature is kept for a relatively short time (for example, 1 to several ten seconds), and an inert gas such as Argon (Ar) and/or ammonia gas ($NH_3$) are flown thereto.

Figure 5:
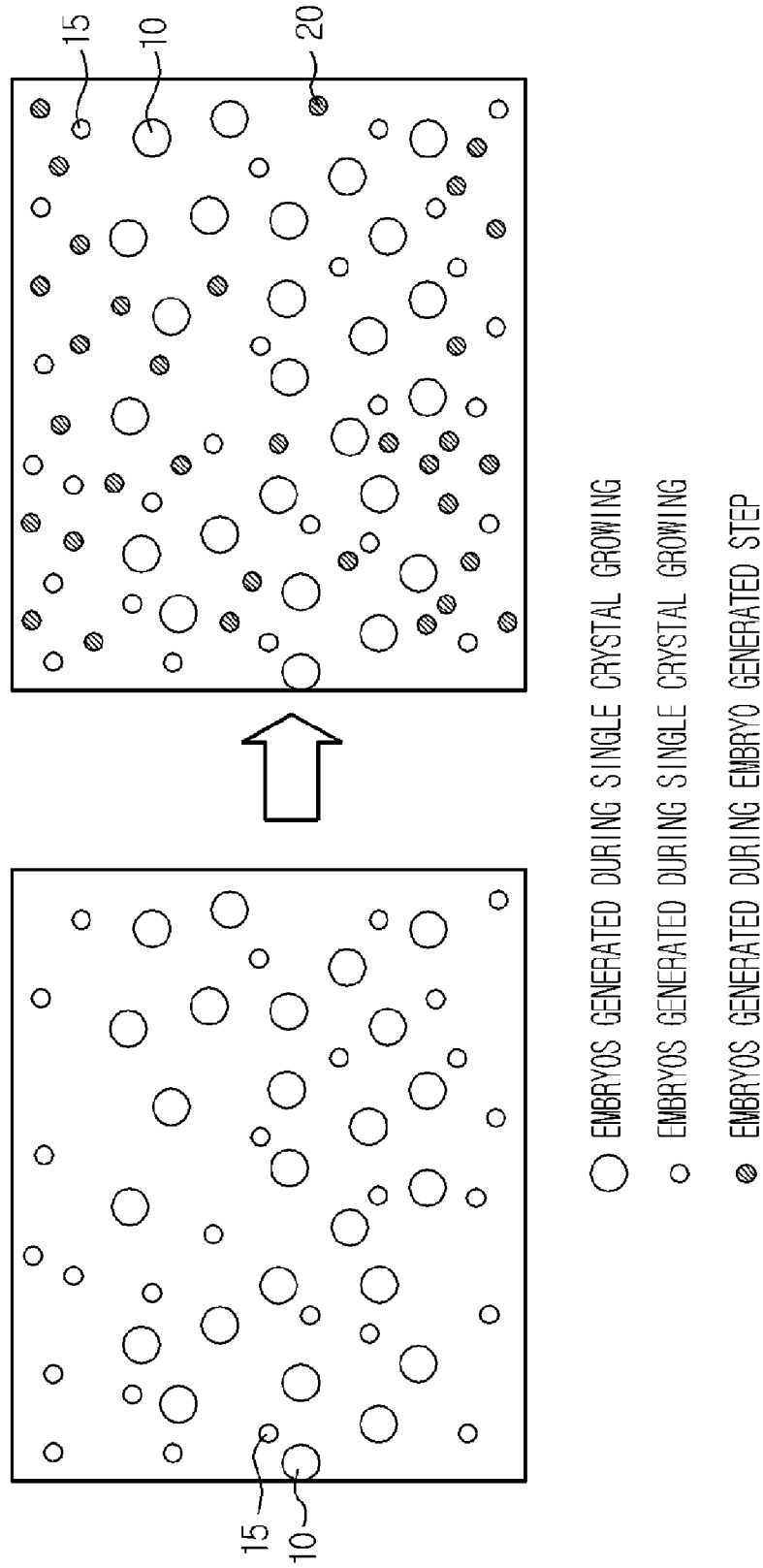
FIG. 5 is a schematic view showing a process of generating embryos that become oxygen precipitates by a succeeding annealing according to an embodiment of the present invention.

Then, as shown in FIG. 5, embryos 20 are generated over the entire region of the wafer. Meanwhile, as shown in FIG. 5, embryos 10, 15 already generated with various sizes while growing the silicon single crystal (S10) may exist in the wafer. In this case, the embryos 10, 15 already generated and the embryos 20 generated in the step S40 are not substantially distinguished, but they are shows distinguishably in FIG. 5 for better understanding.

Meanwhile, as explained above, in case of a silicon single crystal ingot or wafer, the embryos generated during the single crystal growing may have different densities and sizes due to a position in an ingot, a radial direction or a crystal defect region, so the internal gettering ability may also be different accordingly. Thus, the embryo generating step increases density of embryos over a predetermined level to give a constant gettering ability. That is to say, in case embryos generated during the single crystal growing step already have sufficiently uniform and high density (namely, in case the initial oxygen concentration is over 12 ppma and the crystal defect region is in a vacancy-rich region as an example, based on the above explanation), this step may not be executed.

The embryos 10, 15, 20 of this step including the embryos generated during the embryo generating step are not still stabilized, so they may easily return to individual particles (interstitial oxygen atoms and silicon atoms). Thus, it is preferred to conduct a step of stabilizing the embryos as follows.

That is to say, as mentioned above, embryos should be grown into oxygen precipitates to have gettering ability, during the semiconductor device manufacturing process. The most essential factor in the growing conditions into oxygen precipitates is a temperature in the semiconductor device manufacturing process. If this temperature is too low or too high, the embryos may not be easily grown into oxygen precipitates. Thus, in order that the embryos may grow into oxygen precipitates without being seriously affected by various succeeding thermal annealing temperatures, the embryos becoming oxygen precipitates should be grown over a critical size greater than a size of embryos generated during the single crystal growing step. This embryo stabilizing step is executed to grow embryos over a certain size such that the embryos may be easily grown into oxygen precipitates by succeeding thermal annealing.

The embryo stabilizing step is preferably applied regardless of initial oxygen concentration in case of a general wafer. However, if embryos are already stabilized such as a wafer doped with heterogeneous elements (nitrogen, carbon, and so on) or a wafer doped with impurities in high concentration (for example, with a resistivity of 1 Ω-cm or the less), this step may not be applied.

More specifically, the embryo stabilizing step (S50) is conducted using thermal annealing at a second temperature ($T_2$). In more detail, the temperature in the RTP equipment is rapidly changed from the first temperature ($T_1$) to the second temperature ($T_2$) at a predetermined temperature changing rate (for example, 50~70/sec). If the temperature in the equipment reaches the second temperature ($T_2$), the second temperature is kept for a predetermined time (for example, 1 to several ten seconds) to stabilize the embryos. At this time, inert gas such as Ar is continuously flown thereto, but $NH_3$ gas flown in the step S40 is intercepted.

Figure 4:
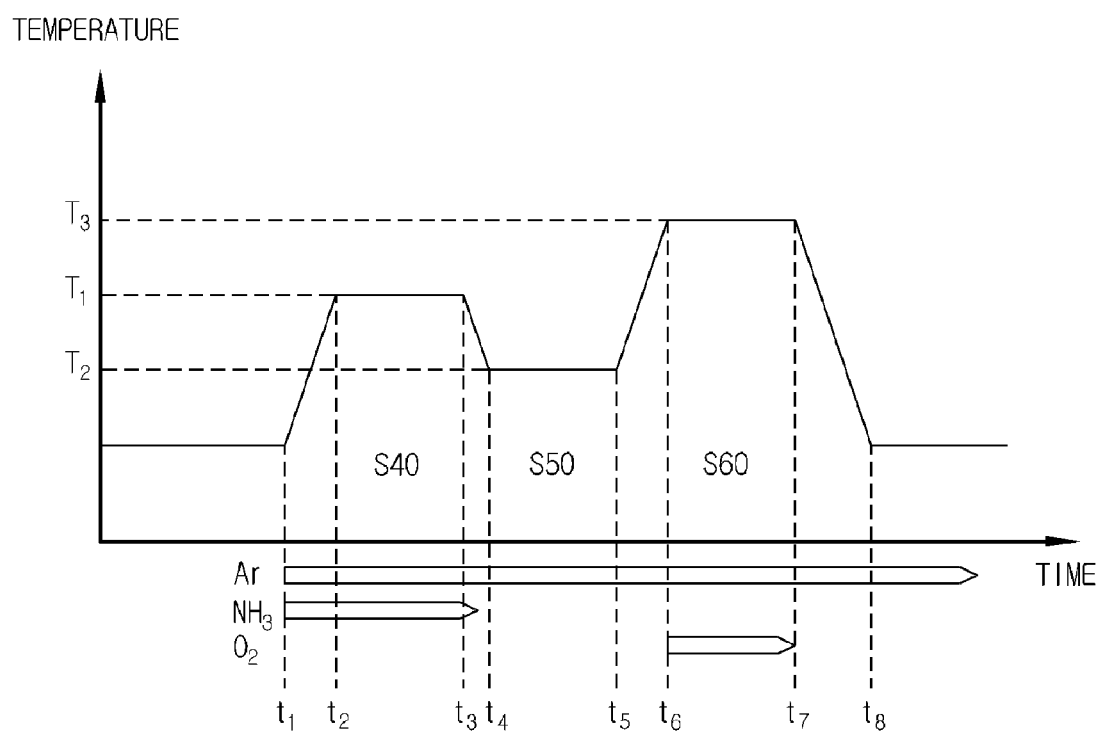
FIG. 4 is a diagram showing the process according to the embodiment of the present invention.

Here, the second temperature ($T_2$) is lower than the first temperature ($T_1$) in many cases as shown in FIG. 4, but it is set in various ways depending on the kind of impurity atoms other than oxygen that composes embryos and oxygen precipitates, on occasions higher than the first temperature. That is to say, in case the wafer is a pure silicon wafer substantially not including impurities other than oxygen, the embryos and oxygen precipitates become SiOx, and the second temperature ($T_2$) is preferably 600 to 900. Meanwhile, in case boron (B) is included as impurity, the embryos and oxygen precipitates become BOx, and the second temperature is preferably 400 to 800. In addition, in case the silicon wafer includes nitrogen (N) as impurity, the embryos and oxygen precipitates become NOx, and the second temperature is preferably 600 to 1,000. Meanwhile, in case vacancy is present at a very high density in a raw wafer (namely, a wafer processed to the preprocessing step (S30)), the embryos become a combination of SiOx-vacancy, and the second temperature is preferably 1,100 to 1300.

Figure 6:
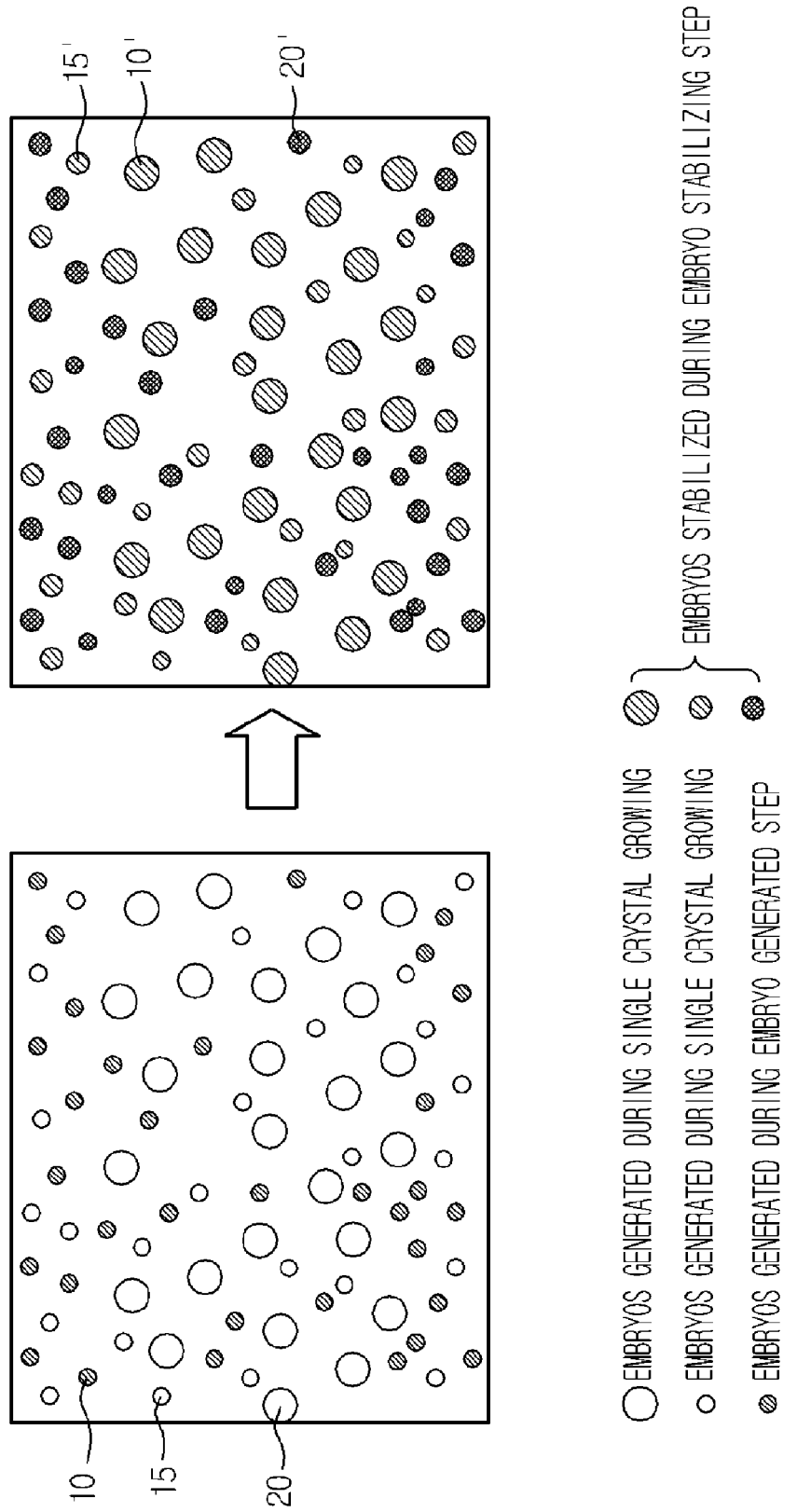
FIG. 6 is a schematic view showing a process of stabilizing the embryos of FIG. 5 according to an embodiment of the present invention.

If the second temperature is set differently depending on the kind of impurity included in the wafer and then kept for a predetermined time as mentioned above, the embryos 10, 15, 20 existing in the wafer are stabilized (see 10', 15', 20') without easily returning to individual atoms, and they are grown into oxygen precipitates by thermal annealing applied during the semiconductor device manufacturing process, as shown in FIG. 6. Meanwhile, similarly to FIG. 5, the embryos 10', 15' already generated in the silicon single crystal growing step (S10) and stabilized in the step S50 and the embryos 20' generated in the step S40 and stabilized in the step S50 are substantially not distinguished, but they are illustrated distinguishably in FIG. 6 for better understanding.

Subsequently, a step for removing surface defects to form a denuded zone to a predetermined depth from a surface of a wafer that will be used for making a semiconductor device is conducted. As mentioned above, oxygen precipitates act as a gettering site in the bulk region. However, in case the oxygen precipitates are present in a region where semiconductor devices are made (about 5 to 30 μm from the wafer surface), they may give a direct influence on device yields such as junction current and leakage current. For this purpose, it is preferred to remove embryos present within a certain depth, and it will be enabled using the surface defect removing step.

The surface defect removing step is always conducted for most wafers. Particularly, in case of a wafer experiencing the aforementioned embryo generating and stabilizing steps, embryos may exist on a surface area of the wafer. Thus, it is necessary to conduct the defect removing step for a wafer experiencing the above embryo generating step S40 or the above embryo stabilizing step S50, a wafer doped with heterogeneous element (nitrogen, carbon, and so on), a wafer doped with impurities at high concentration, or a wafer having a relatively high initial oxygen concentration (for example, 8 ppma or more).

Specifically, the surface defect removing step (S60) is conducted at a third temperature ($T_3$) higher than the first temperature ($T_1$) by RTP. In more detail, the temperature in the RTP equipment is rapidly changed from the second temperature ($T_2$) to the third temperature ($T_3$, for example 1,200 to 1,300) at a predetermined temperature changing rate (for example, 50 to 70/sec). If the temperature in the equipment reaches the third temperature ($T_3$), the third temperature is kept for a predetermined time (for example, 1 to several ten seconds). At this time, inert gas such as Ar is continuously flown thereto, and on occasions, a small amount of oxygen ($O_2$) may be flown thereto together.

Figure 7:
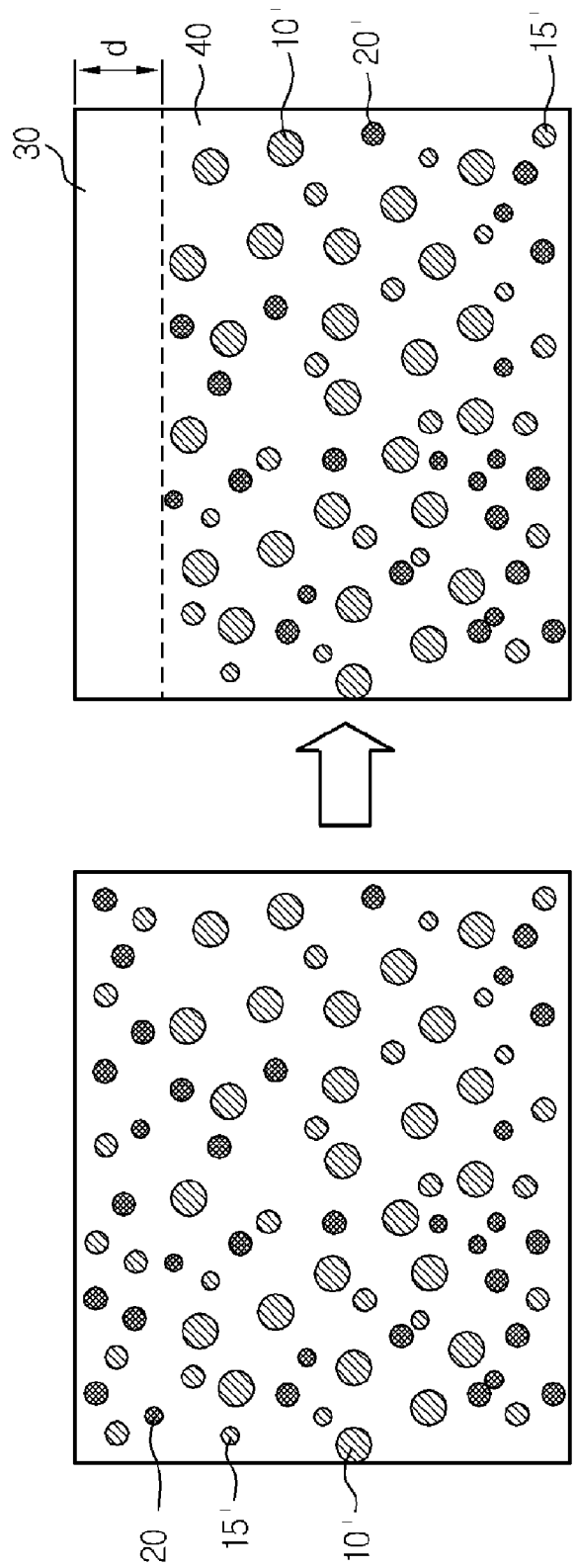
FIG. 7 is a schematic view showing a process of removing defects on a wafer surface according to an embodiment of the present invention.

Then, as shown in FIG. 7, the embryos 10', 15', 20' are substantially entirely removed to a predetermined depth (d) from the wafer surface to form a denuded zone 30, and a region below it becomes a bulk region having the stabilized embryos 10', 15', 20'. Meanwhile, though only an area near one side surface of a wafer is shown in FIG. 7, the denuded zone is formed in both of front and rear surfaces of the wafer by executing the step S60.

After the steps S40 to S60 are executed as mentioned above, the temperature in the RTP equipment is lowered at a predetermined temperature decreasing rate (for example, 50/sec), and then the wafer is unloaded, thereby completing the embryo generating and stabilizing process. Common polishing process and cleaning process are conducted for the unloaded wafer to completely make a wafer to be provided for making a semiconductor device.

The silicon wafer manufactured according to the present invention is a silicon wafer in which distribution of embryos therein is changed from a raw wafer, by means of a first thermal annealing for generating embryos that become oxygen precipitates by succeeding thermal annealing in a silicon wafer, a second the thermal annealing for stabilizing the embryos generated in the silicon wafer, and a third thermal annealing for removing embryos and defects within a predetermined depth from front and rear surfaces of the silicon wafer. That is to say, the raw wafer becomes a silicon wafer of the present invention in a way that origins of embryos, namely coupling energy possessed by oxygen and silicon in an atomic level, are changed, and thus distribution of the embryos are changed.

More specifically, the silicon wafer manufactured according to the present invention and to be provided for making a semiconductor device has a greater concentration of embryos in the bulk layer rather than in the surface layer, when the surface layer is defined to a predetermined depth from front and rear surfaces of the wafer (or, at least a front surface on which a semiconductor device will be formed) toward a center plane, and the bulk layer is defined as a region between the surface layer and the center plane.

Figure 2:
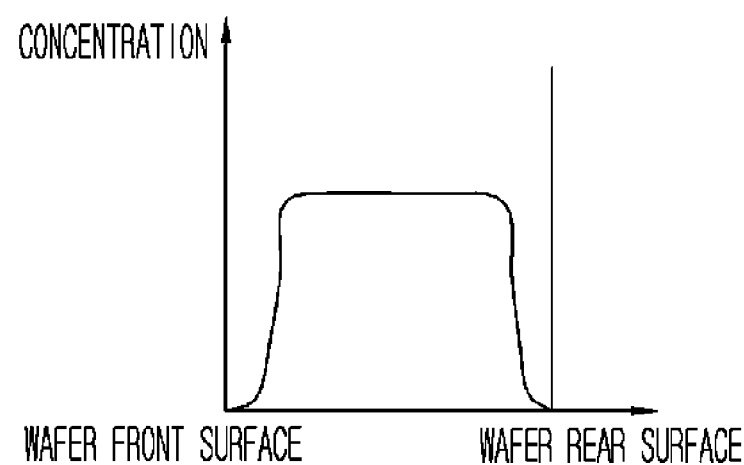
FIG. 2 is a graph showing a concentration profile of BMD (Bulk Micro-Defect) including oxygen precipitates and bulk stacking faults after a succeeding annealing is conducted to a wafer to which two-stage RTP is executed according to another prior art.

In addition, the embryos distributed at a higher concentration in the bulk layer has substantially uniform distribution in the entire bulk layer, so it may give a concentration profile similar to that shown in FIG. 2. In another case, the embryos may have a concentration profile that forms a peak on the center plane or forms at least two peaks in the region between the front and rear surfaces, similarly to that shown in FIG. 1. However, it should be noted that the concentration profile shown in FIGS. 1 and 2 is a concentration profile of BMD including oxygen precipitates and bulk stacking faults after succeeding thermal annealing, not a concentration profile of embryos, but their profile patterns are similar to each other.

Meanwhile, each of the embryo generating step (S40), the embryo stabilizing step (S50) and the surface defect removing step (S60) may be excluded depending on characteristics of a raw wafer (or, a wafer experiencing up to the wafer preprocessing step (S30)), as mentioned above. Further, though it has been illustrated and explained that the embryo generating step (S40), the embryo stabilizing step (S50) and the surface defect removing step (S60) are executed in the above order, but the present invention is not limited thereto. That is to say, the above three steps may be rearranged or skipped like S50-S60, S40-S60-S50, and S60-S50, depending on characteristics of the raw wafer.

As mentioned above, according to the wafer manufacturing method of the present invention, embryos that are combinations of silicon atoms or impurity atoms of a wafer and interstitial oxygen atoms are generated and stabilized such that the embryos may become oxygen precipitates by means of succeeding thermal annealing applied during a semiconductor device manufacturing process.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

[Industrial Applicability]

According to the present invention as explained above, since embryos becoming oxygen precipitates by succeeding thermal annealing are generated and stabilized, it is possible to make a wafer with high reliability and reproducibility such that concentration and distribution of the oxygen precipitates formed by succeeding thermal annealing may be controlled into a desired profile.

In addition, according to the present invention, the degree of freedom for processing is increased suitable for various conditions since the steps for generating embryos, stabilizing the embryos and removing surface defects may be rearranged or skipped conforming to characteristics of a raw wafer.

Further, the present invention suggests conditions of generating and stabilizing embryos of not only a pure silicon wafer but also a wafer including other impurities, so it is easy to control concentration and distribution of oxygen precipitates of various kinds of wafers.

The invention claimed is:

1. A method for manufacturing a silicon wafer, comprising:
preparing a wafer having a front surface, a rear surface and a rim edge connecting the front and rear surfaces;
generating embryos, which become oxygen precipitates by succeeding annealing, in the silicon wafer;
stabilizing the embryos generated in the silicon wafer; and
removing defects and the embryos existing within a predetermined depth from the front and rear surfaces of the silicon wafer, after the step of stabilizing the embryos,
wherein the step of generating embryos is conducted in a way of thermally annealing the silicon wafer at a first temperature,
wherein the step of stabilizing the embryos is conducted in a way of thermally annealing the silicon wafer with the embryos at a second temperature, wherein the step of removing defects and the embryos is conducted in a way of thermally annealing the silicon wafer at a third temperature higher than the first temperature, and wherein the thermal annealing executed at the first temperature and the thermal annealing executed at the second temperature are conducted for 1 to several ten seconds, respectively.

2. The method for manufacturing a silicon wafer according to claim 1, wherein the first temperature is in the range of 1,100 to 1,200° C.

3. The method for manufacturing a silicon wafer according to claim 1, wherein the step of generating the embryos is conducted under Ar gas and/or NH3 gas atmosphere.

4. The method for manufacturing a silicon wafer according to claim 1, wherein the silicon wafer includes substantially no impurity other than oxygen, and wherein the second temperature is in the range of 600 to 900° C.

5. The method for manufacturing a silicon wafer according to claim 1, wherein the silicon wafer includes boron as impurity other than oxygen, and wherein the second temperature is in the range of 400 to 800° C.

6. The method for manufacturing a silicon wafer according to claim 1, wherein the silicon wafer includes nitrogen as impurity other than oxygen, and wherein the second temperature is in the range of 600 to 1,000° C.

7. The method for manufacturing a silicon wafer according to claim 1, wherein the silicon wafer is a silicon wafer in a vacancy-rich region, and wherein the second temperature is in the range of 1,100 to 1,300° C.

8. The method for manufacturing a silicon wafer according to claim 1, wherein the thermal annealing executed at the third temperature is conducted for 1 to several ten seconds.

9. The method for manufacturing a silicon wafer according to claim 8, wherein the third temperature is in the range of 1,200 to 1,300° C.

10. The method for manufacturing a silicon wafer according to claim 1, wherein the silicon wafer has a diameter of 12 inch or more.

* * * * *